United States Patent
Pinarbasi et al.

(10) Patent No.: US 7,824,947 B2
(45) Date of Patent: Nov. 2, 2010

(54) METHOD TO IMPROVE FLEXIBLE FOIL SUBSTRATE FOR THIN FILM SOLAR CELL APPLICATIONS

(75) Inventors: Mustafa Pinarbasi, Morgan Hill, CA (US); Serdar Aksu, Santa Clara, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 113 days.

(21) Appl. No.: 12/233,563

(22) Filed: Sep. 18, 2008

(65) Prior Publication Data
US 2009/0203165 A1 Aug. 13, 2009

Related U.S. Application Data

(60) Provisional application No. 60/973,443, filed on Sep. 18, 2007.

(51) Int. Cl.
*H01L 21/00* (2006.01)
(52) U.S. Cl. .............. 438/57; 438/72; 438/73; 257/E31.003; 257/E27.118; 257/E25.004; 257/E25.009
(58) Field of Classification Search .......... 438/57, 438/72, 73; 257/E27.124, E27.125, E25.007, 257/E31.001, E27.118, E25.004, E25.009
See application file for complete search history.

(56) References Cited

U.S. PATENT DOCUMENTS 6,379,476 B1 * 4/2002 Tarutani et al. ............ 148/325
2001/0029978 A1 * 10/2001 Nakai et al. ............... 136/258

OTHER PUBLICATIONS

Basol, Bulent M., et al., "Status of Flexible CIS Research at ISET", *NASA Document ID*; 19950014096, Accession No. 95N-20512, pp. 101-106.
Basol, Bulent M., et al., "Modules and Flexible Cells of CuInSe2", *Proc. of the 23rd Photovoltaic Spec. Conf.*, 1993, pp. 426-430.

* cited by examiner

*Primary Examiner*—Michelle Estrada
(74) *Attorney, Agent, or Firm*—Pillsbury Winthrop Shaw Pittman, LLP

(57) ABSTRACT

A thin film solar cell including a Group IBIIIAVIA absorber layer on a defect free base including a stainless steel substrate is provided. The stainless steel substrate of the base is surface treated to remove the surface roughness such as protrusions that cause shunts. Before removing the protrusions, a thin protective ruthenium film is first deposited on the recessed surface portions of the substrate to protect these portions during the following protrusion removal. The protrusions on the surface receives very little or no ruthenium during the deposition. After the ruthenium film is formed, the protrusions are etched and removed by an etchant which only attacks the stainless steel but neutral to the ruthenium film. A contact layer is formed over the ruthenium layer and the exposed portions of the substrate to complete the base.

10 Claims, 2 Drawing Sheets

METHOD TO IMPROVE FLEXIBLE FOIL SUBSTRATE FOR THIN FILM SOLAR CELL APPLICATIONS

This application relates to and claims priority from U.S. Provisional Application No. 60/973,443, entitled "Substrate Planarization for Thin Film Solar Cell Manufacturing," filed Sep. 18, 2007, which application is expressly incorporated by reference herein. This application is also related to U.S. application Ser. No. 12/233,566 entitled "Substrate Preparation for Thin Film Solar Cell Manufacturing," filed Sep. 18, 2008.

BACKGROUND

1. Field of the Invention

The present inventions relate to thin film solar cell fabrication methods and structures.

2. Description of the Related Art

Solar cells are photovoltaic (PV) devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce the cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA chalcopyrite compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which includes a material in the family of $Cu(In,Ga,Al)(S,Se,Te)_2$, is grown over a conductive layer 13, which is previously deposited on the substrate 11 and which acts as the electrical contact to the device. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) or a grid pattern may also be deposited over the transparent layer 14 to reduce the effective series resistance of the device. A variety of materials, deposited by a variety of methods, can be used to provide the various layers of the device shown in FIG. 1. It should be noted that although the chemical formula for a CIGS(S) layer is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

One way of reducing the cost of thin film photovoltaics is to process thin film CIGS(S) type solar cells on flexible metallic foils so that the depositions of multiple films or layers constituting the solar cell structure, such as the contact layer, the CIGS(S) absorber film, the transparent layer and the metallic grids, may all be performed over the flexible foil substrate in a roll-to-roll fashion. This way a long (such as 500-5000 meters long) foil substrate may be processed in relatively compact process tools to form a roll of solar cells, which may then be cut and used for module fabrication. Choice of the substrate material is very important for thin film solar cells since the layers in these device structures are only 1-5 micrometers (μm) thick and they get affected by the nature of the substrate during and after processing. For example, the typical thicknesses of the contact layers, the CIGS absorber layers and transparent layers are 0.3-1μ, 1-3μ and 0.1-0.5μ, respectively.

Stainless steel foils are widely used flexible metallic substrates to manufacture CIGS solar cells. However, one problem associated with the use of stainless steel substrates is the surface roughness of the foil and the defects associated with the surface roughness. Topographical defects such as protrusions, gouges and spikes often appear on stainless steel foils and they can originate from different sources such as foreign particle (such as metal particle or ceramic particle) inclusions in the steel foil, defects in the steel and rolling defects and particles which may be introduced on the steel foil surface during the rolling process for foil formation. Depending on their size, such defects not only reduce the efficiency of the solar cells manufactured on such foil surfaces but may also cause complete electrical shunts which are detrimental to solar cell performance.

FIG. 2 illustrates a solar cell device structure 50 built on a defective area of a stainless steel foil substrate 52 to exemplify a plausible mechanism that forms shunts within the solar cell device structure. The surface of stainless steel foil substrate includes exemplary protrusions 54 or spikes which may have a height in the range of 100-2000 nm, or even higher. A contact layer or conductive layer 56 is typically a 200-1000 nm thick film of a refractory metal such as Mo, typically deposited by a physical vapor deposition technique such as sputtering. Therefore, when deposited over the rough surface of the substrate 52, the contact layer 56 may have discontinuities or defective portions where the underlying substrate is exposed, especially over the locations of the protrusions 54. When an absorber film 58 is formed over the contact layer 56, the substrate 52 would be exposed to the absorber film 58 and to the reactive atmosphere that is present during the growth of the absorber film 58 at the locations of the discontinuities. As a result, chemical interaction may take place between the substrate 52 and the constituents of the absorber film 58 at these locations. For example, for stainless steel substrates, iron in the stainless steel may react with the Se in the CIGS film growth environment forming iron selenides in the defect regions. Also iron atoms diffusing from the substrate 52 into the absorber 58 through the discontinuities in the contact layer 56 may poison the regions of the absorber 58 directly above the discontinuities. When the solar cells are completed by deposition of the transparent layer 60, these poisoned regions cause excessive current leakage or shunts reducing the efficiency of the devices. It should be noted that excessive iron in CIGS material lowers its resistivity and degrades its photovoltaic performance. In an alternate mechanism, the regions where the contact layer 56 is discontinuous may not be coated effectively by the absorber film 58, giving rise to pinholes 62 that may cause shunts, which are killer defects for solar cells. As can be seen in FIG. 2, the transparent layer 60 is in direct contact with the substrate 52, through the protrusions 54 at the locations of the pinholes 62.

Various surface planarization methods, including electropolishing, do not effectively reduce the surface roughness of such stainless steel foils because etchants also etch the surface portions around the peaks and deepen such portions. As a result of this, the spikes or the peaks tend to stay and in most cases new ones are created as more defects such as inclusions hidden in the foil body get exposed through the etched surface.

From the foregoing, the much needed manufacturing process yield improvements require identification and development of metallic foil substrates and the processes that are better suited for large volume roll-to-roll processing and manufacturing of CIGS solar cell and modules.

SUMMARY

The present inventions relate to thin film CIGS solar cell structures.

In one aspect, embodiments of the present invention provides a specific flexible metallic foil substrate that improves device performance and manufacturing process yield.

These and other aspects and advantages, among others, are described further hereinbelow.

DETAILED DESCRIPTION

The embodiments of the present invention provide a flexible foil base that enhances the efficiency and manufacturing yield of flexible II-VI compound semiconductor solar cells, i.e. Group IIBVIA thin film solar cells such as CdTe solar cells and Group IBIIIAVIA thin film solar cells such as CIGS (S) type solar cells. The preferred solar cell structure is a Group IBIIIAVIA thin film solar cell which will be described hereinafter.

The base of the thin film solar cell includes a substrate that is surface treated using a process that employs a conductive and permanent protective film to protect the surface of the metallic substrate while the protrusions on the surface removed by a material removal process. Although the embodiments of the invention will be described using a CIGS solar cell as an example, it will be appreciated that the embodiments are applicable to any flexible thin film solar cell employing a Group IIBVIA (such as CdTe) or a Group IBIIIAVIA compound semiconductor absorber film. In a preferred embodiment of the present invention, a flexible foil base may comprise a stainless steel substrate, a protective film formed on the stainless steel substrate, and a defect free continuous back contact layer formed over the protective film.

The protective thin film covers and protects the surface portions or recessed portions around the peaks or spikes from an etchant employed during a material removal process. The protrusions are not completely covered with the protective layer and hence are exposed to the etchant which removes them from the surface of the substrate. The protective film is conductive and it is made of a metal or alloy that cannot be etched by or substantially resistant to the etchant used during the removal of the peaks. In the context herein, an etchant may be any wet or dry etching chemical species. The base of the removed protrusions exposes the substrate material through openings within the protective film and thus the surface of the protective film is discontinuous and it partially includes openings through which the substrate portions are exposed. The surface of the protective film and the exposed surface portions of the substrate may be substantially coplanar. The back contact layer is deposited on the protective film and the exposed substrate portions in a substantially planar manner. As opposed to the above described prior art back contact films, the back contact film is a continuous film having no discontinuities or defects and strongly adheres to the protective film as well as the exposed substrate portions. In the following steps, an absorber layer and a transparent layer is formed on the base.

Figure 1:
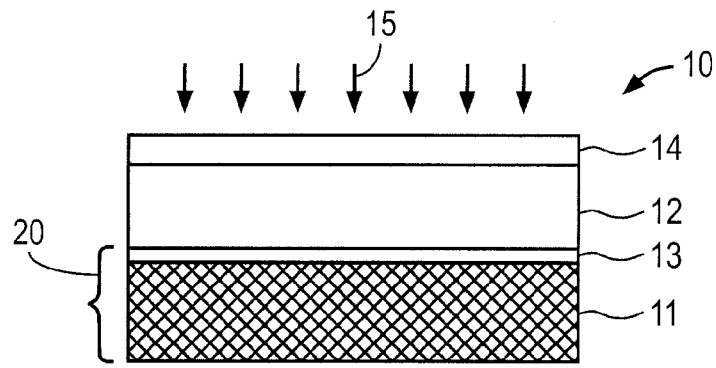
FIG. 1 is a schematic illustration of a prior art solar cell structure.
Figure 2:
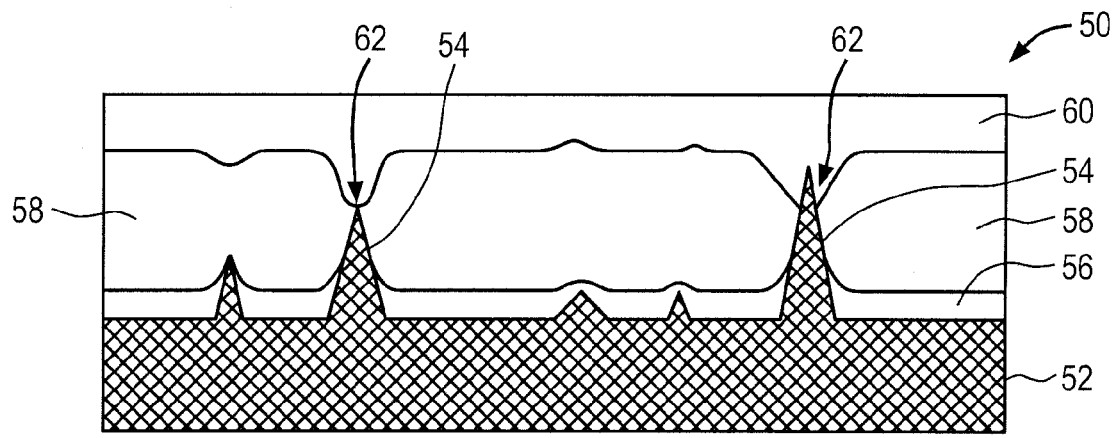
FIG. 2 is schematic illustration of a prior art solar cell structure which has been built on a substrate having surface roughness.
Figure 3A:
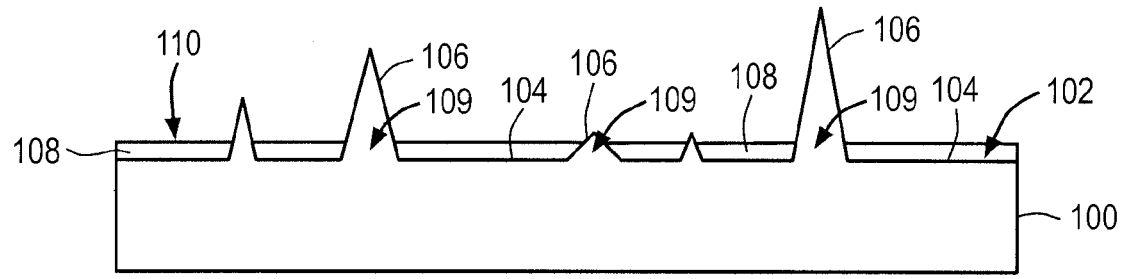
FIG. 3A is a schematic illustration of a structure with a substrate having surface roughness including protrusion and recesses, wherein an etch resistive film has been formed over the recesses.

Reference will now be made to the drawings wherein like numerals refer to like parts throughout. FIG. 3A shows an exemplary substrate 100 such as a steel substrate having a front surface 102 with substantially flat surface portions 104 (also referred to as recessed surface portions) and protrusions 106 or elevated surface portions which will be removed. The protrusions 106 are defective surface regions having mostly peaks or spikes of steel extending outwardly from the front surface. The height of protrusions 106 may be in the range of 100 nm to 5000 nm or even more. In this embodiment, the substrate 100 is stainless steel; however, the same principles may be applied to other metal or alloy foil substrates, such as aluminum foil substrates. A protective film 108 having a top surface 110 is formed over the surface 102, preferably using a sputter deposition process. The protective film 108 generally covers the recessed portions 104 of the front surface 102. The protrusions 106 receive little or no protective film material due to their geometry; therefore the protrusions 106 are not coated with the protective film 108 in a continuous manner. Once the protective film 108 coats the recessed portions 104 of the front surface 102, the protrusions 106 may be seen as extending through the discontinuous regions 109 or openings in the protective film 108. The protective film 108 is preferably a thin conductive film that cannot be etched by the etchant material of the subsequent planarization step. In the preferred embodiment the protective film 108 comprises one of ruthenium (Ru), iridium (Ir), osmium (Os), tantalum (Ta) and hafnium (Hf). The thickness of the protective film 108 may be in the range of 100-1000 angstrom (Å). It should be noted that some of the preferred materials listed above for the protective film 108 are themselves relatively inert (such as Ru, Ir, Os) or they comprise naturally occurring native oxide layers on their surfaces that render them inert. For example, Ta and Hf films are known to develop a thin surface oxide film once exposed to air. Other materials that develop such oxide layers on their surfaces are also good candidates to be used as the material of the protective film 108.

Figure 3B:
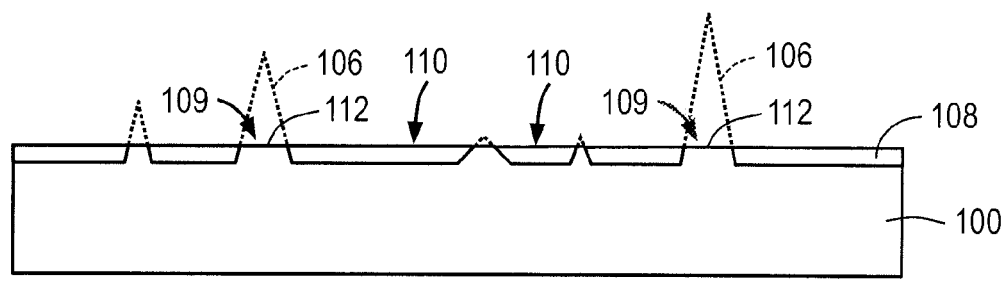
FIG. 3B is a schematic illustration of the structure shown in FIG. 3A, wherein the protrusions have been removed from the surface of the substrate using an material removal process.

In the following step, a material removal process employing an etchant is applied to selectively remove the protrusions 106 extending through the openings 109 in the protective film 108. The etchant material selectively attacks the exposed protrusions 106 but not the protective film 108 and the recessed portions covered by the protective film. Therefore, during the material removal process, the protective film 108 protects the underlying recessed portions 104 of the front surface 102 of the substrate 100. For example, if the protective film is made of Ru an HCl solution may be used as an etchant for this purpose. The same may be achieved using electropolishing with acidic solutions that can remove the steel but not the protective film 108 covering the recessed portions 104. The etching step may also be achieved through use of vapors in a dry etch method or through a plasma etching or ion beam milling step. As shown in FIG. 3B, selective removal of the protrusions 106 forms substrate sections 112 surrounded by the protective film 108. The substrate sections 112 are portions of the substrate that is exposed through the openings 109 in the protective film 108 after the removal of the protrusions 106. Surfaces 113 of the substrate sections 112 are preferably substantially coplanar with the top surface 110 of the protective film 108. Such co-planarity may be achieved by careful timing of the etching step. If the material removal process is a planarization process (such as electropolishing) the surfaces 113 of the substrate sections 112 are substantially planar.

Figure 3C:
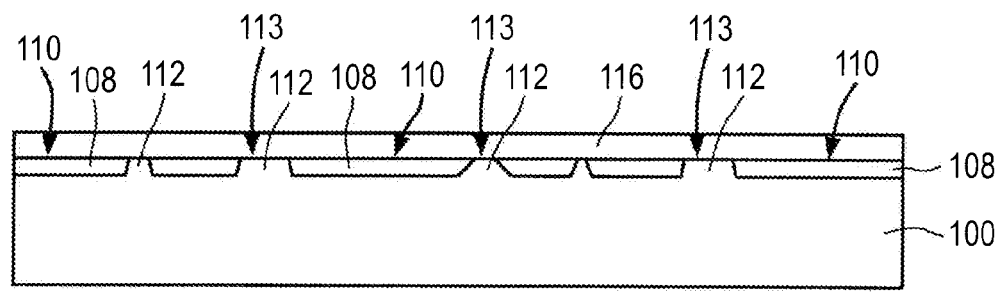
FIG. 3C is a schematic illustration of the structure shown in FIG. 3B, wherein a contact layer has been deposited over the etch resistive film and the exposed surface portions of the substrate formed during the material removal process.

As shown in FIG. 3C, a contact layer 116 is formed on the top surface 110 of the protective layer 108 and the surfaces 113 of the substrate sections 112. The contact layer 116 is a continuous layer and strongly adheres to the substrate sections 112 and the protective layer 108.

Figure 3D:
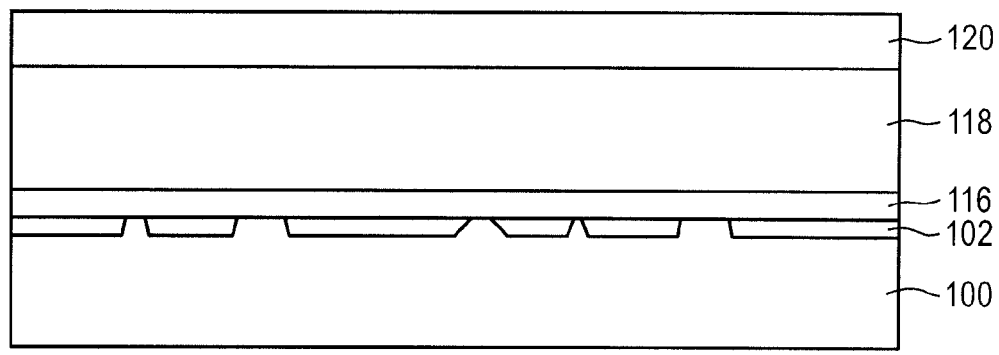
FIG. 3D is a schematic illustration of the structure shown in FIG. 3C, wherein a CIGS absorber layer and a transparent layer have been formed over the contact layer to form a solar cell structure.

As shown in FIG. 3D in the following step, a Group IBIIIAVIA semiconductor absorber layer 118 such as a CIGS layer is formed on the contact layer 116. The solar cell structure is completed by deposition of a transparent layer 120 including a buffer layer (not shown) and a transparent conductive layer (not shown) over the CIGS absorber layer 118. The contact layer 116 may be a multi-layer structure itself comprising materials that provide; i) good diffusion barrier action against iron (Fe) diffusion into the CIGS absorber layer, ii) good ohmic contact to the CIGS absorber layer, and, iii) good adhesion to the flexible substrate 100. Such materials include, but are not limited to tungsten (W), tantalum (Ta), molybdenum (Mo), titanium (Ti), chromium (Cr), ruthenium (Ru) and iridium (Ir), osmium (Os) their alloys and/or nitrides.

The CIGS absorber layer 118 may be deposited on the contact layer 116 using various techniques well known in the field. These techniques include evaporation, sputtering, ink deposition, electroplating, two-stage techniques, etc. In electroplating method, first a precursor film including at least copper, indium and gallium is electroplated. The precursor film is then reacted at about 400-600° C. in presence of selenium and/or sulfur (which may be included in the precursor film or may be provided from the reaction environment) to form the CIGS absorber layer. The buffer layer is often a sulfide compound such as cadmium sulfide and indium sulfide. The transparent conductive layer may be a transparent conductive oxide (TCO) such as zinc oxide (ZnO), indium tin oxide (ITO), and indium zinc oxide (IZO). The transparent conductive layer may also be a stacked layer of the TCOs listed above. There may be a grid pattern or finger pattern (not shown) formed over the transparent layer 120.

In roll-to-roll manufacturing of CIGS solar cells, all of the above described process steps may be performed in a roll-to-roll tool fashion. In a roll to roll process, the substrate may be a continuous workpiece that may be supplied from a supply roll. After some of or all of the above described process steps, e.g., forming of the protective layer, removal of the protrusions, forming of the contact layer and the following steps, the processed workpiece is taken up and wrapped around a receiving roll. The absorber layer 118, the transparent layer 120, and the finger patterns may also be deposited in a roll-to-roll tool fashion. Although the present inventions are described with respect to certain preferred embodiments, modifications thereto will be apparent to those skilled in the art.

We claim:

1. A method of constructing a thin-film solar cell base structure, comprising:
   providing a stainless steel substrate with a front surface having flat surface portions and protruded surface portions;
   forming a conductive protective film over the front surface of the stainless steel substrate such that the conductive protective film covers the flat surface portions and partially leaves exposed some of the protruded surface portions;
   removing the some of the protruded surface portions by etching the some of the protruded surface portions to form exposed substrate sections of the stainless steel substrate so that the conductive protective film remains within the flat surface portions, wherein the conductive protective film is resistant to the removing by etching; and
   depositing a contact layer on the conductive protective film and the exposed substrate sections.

2. The method of claim 1 wherein the contact layer comprises one of tungsten, tantalum, molybdenum, titanium, chromium, ruthenium, iridium and osmium.

3. The method of claim 2 further comprising forming a Group IBIIIAVIA absorber layer over the contact layer.

4. The method of claim 3, wherein the step of forming the Group IBIIIAVIA absorber layer comprises:
   forming a precursor layer by electrodepositing the precursor layer comprising copper, indium and gallium; and
   reacting the precursor layer in presence of at least one of selenium and sulfur at a temperature range of 400 to 600° C.

5. The method of claim 3 further comprising forming a transparent layer over the Group IBIIIAVIA absorber layer, and forming a terminal including busbars and conductive fingers over the transparent layer, wherein the transparent layer includes a buffer layer including one of cadmium sulfide and indium sulfide deposited over the Group IBIIIAVIA layer and a transparent conductive layer including one of zinc oxide, indium tin oxide, and indium zinc oxide deposited over the buffer layer.

6. The method of claim 1, wherein the conductive protective film comprises one of ruthenium, osmium and iridium.

7. The method of claim 1, wherein the step of forming the protective film comprises sputter depositing ruthenium.

8. The method of claim 1, wherein the selective etching is performed during an electropolishing process to planarize the some of the protruded surface portions.

9. The method of claim 1, wherein the selective etching is performed using an etchant comprising hydrochloric acid.

10. The method of claim 1, wherein surfaces of the exposed substrate sections and a top surface of the conductive protective film are coplanar.

* * * * *